(12) United States Patent
Qiu (10) Patent No.: US 11,872,581 B2
(45) Date of Patent: Jan. 16, 2024

(54) ULTRASONIC WATER JET APPARATUS INCLUDING PIEZOELECTRIC VIBRATION PLATE

(71) Applicant: DISCO CORPORATION, Tokyo (JP)

(72) Inventor: Xiaoming Qiu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 288 days.

(21) Appl. No.: 16/910,444

(22) Filed: Jun. 24, 2020

(65) Prior Publication Data

US 2021/0001381 A1 Jan. 7, 2021

(30) Foreign Application Priority Data

Jul. 2, 2019 (JP) .................. 2019-123614

(51) Int. Cl.
| | | |
|---|---|---|
| *B06B 1/06* | (2006.01) | |
| *B05B 17/06* | (2006.01) | |
| *H01L 21/67* | (2006.01) | |
| *B05B 17/00* | (2006.01) | |
| *H01L 21/687* | (2006.01) | |
| *B08B 3/12* | (2006.01) | |

(52) U.S. Cl.
CPC ...... *B05B 17/0646* (2013.01); *B05B 17/0623* (2013.01); *B06B 1/0603* (2013.01); *H01L 21/67051* (2013.01); *H01L 21/68764* (2013.01); *B08B 3/12* (2013.01)

(58) Field of Classification Search
CPC ..... B08B 3/12; B08B 2203/0288; B08B 3/02; B05B 17/0623; B05B 17/0646; B05B 17/06; B05B 17/0607; B05B 17/0615; B05B 17/063; B05B 17/0638; H01L 21/67051; H01L 21/6715; A61M 15/0085; B06B 1/0644
See application file for complete search history.

(56) References Cited

U.S. PATENT DOCUMENTS

| | | | | |
|---|---|---|---|---|
| 5,020,724 A | * | 6/1991 | Kiyono .................. | F16K 31/004 239/102.2 |
| 5,368,054 A | * | 11/1994 | Koretsky .......... | H01L 21/67051 134/184 |
| 2002/0108631 A1 | * | 8/2002 | Madanshetty ............ | B08B 3/12 134/1 |
| 2003/0142173 A1 | * | 7/2003 | Takahashi ............ | B41J 2/14209 347/68 |

FOREIGN PATENT DOCUMENTS

| | | | | |
|---|---|---|---|---|
| JP | 10151422 A | | 6/1998 | |
| JP | 2003340330 A | | 12/2003 | |
| WO | WO2011/061480 | * | 5/2011 | ............. B05B 17/06 |

\* cited by examiner

*Primary Examiner* — Christopher R Dandridge
(74) *Attorney, Agent, or Firm* — Greer, Burns & Crain, Ltd.

(57) ABSTRACT

An ultrasonic water jet apparatus includes a water accumulation part in which the water supplied from a water supply source is temporarily accumulated, a jet port that jets the water accumulated in the water accumulation part, and a piezoelectric vibration plate including a dome part that is disposed opposed to the jet port in the water accumulation part and propagates the ultrasonic vibration to the water accumulated in the water accumulation part, a flange part that projects outward in the radial direction from a peripheral edge of the dome part, and an annular plate that projects outward in the radial direction from a peripheral edge of the flange part.

6 Claims, 5 Drawing Sheets

ULTRASONIC WATER JET APPARATUS INCLUDING PIEZOELECTRIC VIBRATION PLATE

BACKGROUND OF THE INVENTION

Field of the Invention

The present invention relates to a piezoelectric vibration plate, an ultrasonic water jet apparatus including a piezoelectric vibration plate, and an ultrasonic vibration horn including a piezoelectric vibration plate.

Description of the Related Art

In the case of processing a semiconductor wafer, for example, as disclosed in Japanese Patent Laid-open No. Hei 10-151422 or Japanese Patent Laid-open No. 2003-340330, water to which ultrasonic vibration is propagated is jetted from an ultrasonic cleaning nozzle of an ultrasonic water jet apparatus toward the wafer and the ultrasonic vibration is transmitted to debris such as processing dust that adheres on the wafer to remove the debris from the wafer.

Furthermore, for example, the conventional ultrasonic cleaning nozzle has a supply port that supplies water (cleaning water), a water accumulation part in which the water is accumulated, a jet port formed at the tip of the water accumulation part, and an ultrasonic vibrator (piezoelectric vibration plate) with a flat plate shape. The water accumulation part has a volume that allows temporary accumulation of the water supplied from the supply port and is formed into a shape tapered toward the jet port. The jet port jets the water from the tip of the water accumulation part. Moreover, the piezoelectric vibration plate is disposed opposed to the jet port in the water accumulation part.

SUMMARY OF THE INVENTION

The ultrasonic vibration transmitted from the piezoelectric vibration plate with a flat plate shape to the water accumulated in the water accumulation part is reflected by the inner wall of the water accumulation part. Thus, the reflected ultrasonic vibration and the ultrasonic vibration oscillated from the piezoelectric vibration plate often cancel out each other. In this case, there is a problem that the ultrasonic vibration propagated to the wafer through the cleaning water weakens and the cleaning ability of the ultrasonic cleaning water lowers.

Thus, an object of the present invention is to provide an ultrasonic water jet apparatus that propagates ultrasonic vibration oscillated from a piezoelectric vibration plate to cleaning water without weakening the ultrasonic vibration to improve the cleaning ability of ultrasonic cleaning water.

In accordance with an aspect of the present invention, there is provided a piezoelectric vibration plate including a dome part, a flange part that projects outward in the radial direction from a peripheral edge of the dome part, and an annular plate that projects outward in the radial direction from a peripheral edge of the flange part.

In accordance with another aspect of the present invention, there is provided an ultrasonic water jet apparatus that jets water to which ultrasonic vibration is propagated to a workpiece. The ultrasonic water jet apparatus includes a water accumulation part in which the water supplied from a water supply source is temporarily accumulated, a jet port that jets the water accumulated in the water accumulation part, and a piezoelectric vibration plate including a dome part that is disposed opposed to the jet port in the water accumulation part and propagates the ultrasonic vibration to the water accumulated in the water accumulation part, a flange part that projects outward in the radial direction from a peripheral edge of the dome part, and an annular plate that projects outward in the radial direction from a peripheral edge of the flange part. A recessed surface side of the dome part of the piezoelectric vibration plate is oriented toward the jet port and an outer circumferential part of the annular plate of the piezoelectric vibration plate is supported by a sidewall of the water accumulation part. The ultrasonic vibration generated from the piezoelectric vibration plate by high-frequency power supplied to the piezoelectric vibration plate is concentrated toward the jet port and the water to which the ultrasonic vibration is propagated in the water accumulation part is jetted from the jet port.

In accordance with a further aspect of the present invention, there is provided an ultrasonic vibration horn that concentrates ultrasonic vibration at one point and gives the ultrasonic vibration to a workpiece. The ultrasonic vibration horn includes a piezoelectric vibration plate including a dome part, a flange part that projects outward in the radial direction from a peripheral edge of the dome part, and an annular plate that projects outward in the radial direction from a peripheral edge of the flange part, and a housing that supports the annular plate of the piezoelectric vibration plate in such a manner that a recessed surface side of the dome part is oriented toward the side of the one point at which the ultrasonic vibration is desired to be concentrated.

The piezoelectric vibration plate according to the present invention is supported through the annular plate. Therefore, the ultrasonic vibration generated from the dome part of the piezoelectric vibration plate is amplified through proper setting of the thickness, annular width (ring width), material, and so forth of the annular plate, and it becomes possible to propagate large amplitude to cleaning water or processing water. Thus, the cleaning effect of ultrasonic cleaning water can be improved and dividing of the workpiece including a dividing origin point such as a modified layer by ultrasonic processing water can be executed more surely.

In the ultrasonic water jet apparatus according to the present invention that jets the water to which the ultrasonic vibration is propagated to the workpiece, the outer circumferential part of the annular plate of the piezoelectric vibration plate is supported by the sidewall of the water accumulation part. This makes it possible to propagate, to cleaning water, the ultrasonic vibration with large amplitude resulting from amplification of the vibration of the dome part by the annular plate when the high-frequency power is supplied to the piezoelectric vibration plate. Thus, the cleaning effect of ultrasonic cleaning water can be improved and the inside of a cut groove of the workpiece can be cleaned by the ultrasonic cleaning water.

The ultrasonic vibration horn according to the present invention that concentrates the ultrasonic vibration at one point and gives the ultrasonic vibration to the workpiece through the water, for example, can propagate the ultrasonic vibration with large amplitude resulting from amplification of the vibration of the dome part by the annular plate to a dividing origin point such as a modified layer formed in the workpiece when the high-frequency power is supplied to the piezoelectric vibration plate, and surely execute dividing with use of this dividing origin point as the point of origin.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS (Spinner Cleaning Mechanism Including Ultrasonic Water Jet Apparatus)

Figure 1:
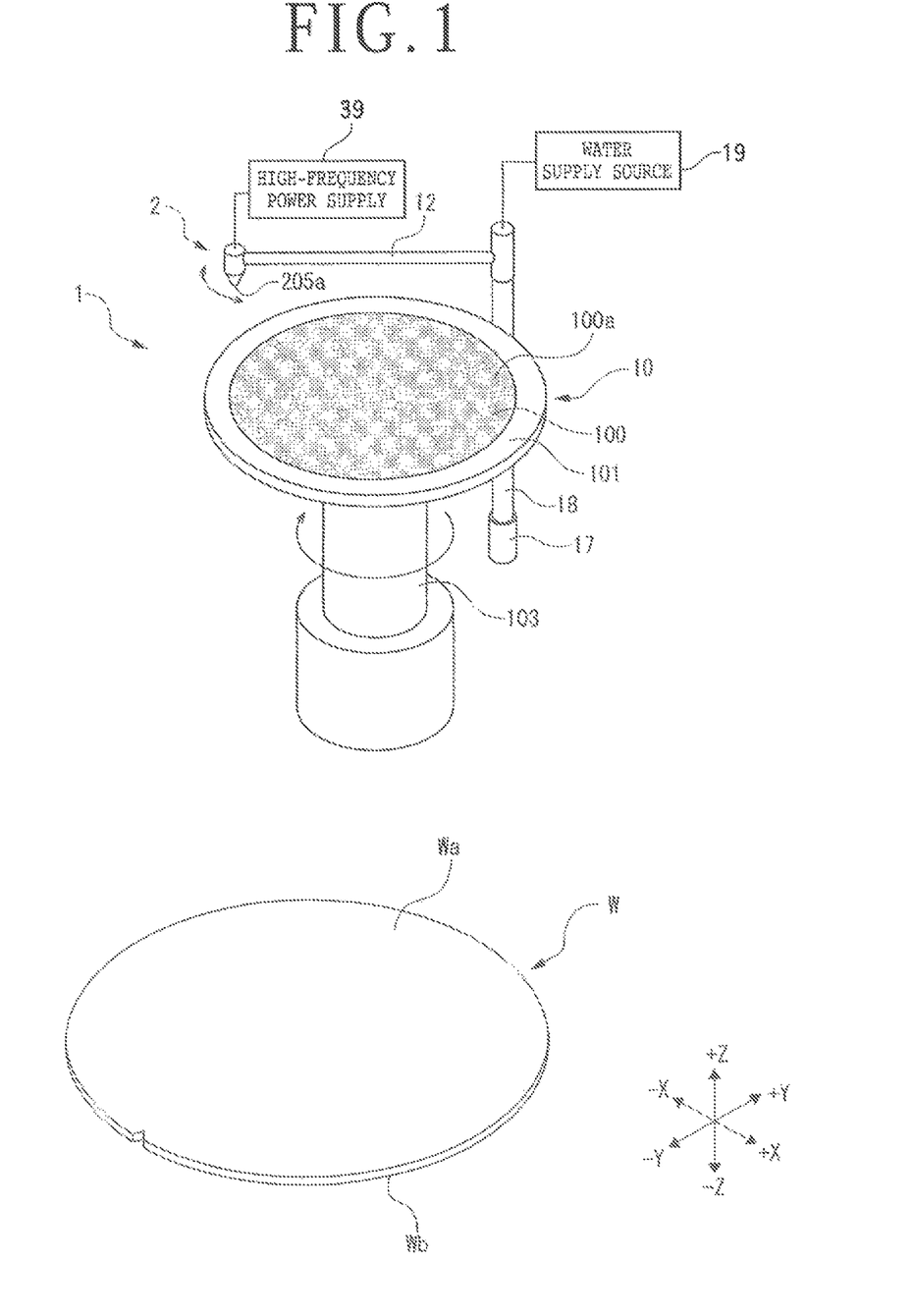
FIG. 1 is a perspective view depicting one example of a spinner cleaning mechanism including an ultrasonic water jet apparatus.

A spinner cleaning mechanism 1 depicted in FIG. 1 includes a spinner table 10 that holds a workpiece W, an ultrasonic water jet apparatus 2 according to the present invention that jets cleaning water to the workpiece W held by the spinner table 10, and a case that surrounds the spinner table 10 and is not depicted in the diagram, for example.

For example, the workpiece W is a semiconductor wafer whose outer shape is a circular shape and an upper surface Wa oriented upward in FIG. 1 becomes a cleaning-target surface. A lower surface Wb of the workpiece W oriented downward in FIG. 1 is protected through sticking of a protective tape that is not depicted in the diagram thereto, for example.

For example, the spinner table 10 has a circular plate shape as its outer shape and includes a suction adhesion part 100 that is formed of a porous member or the like and causes suction adhesion of the workpiece W thereto and a frame body 101 that supports the suction adhesion part 100. The suction adhesion part 100 communicates with a suction source that is not depicted in the diagram. A suction force generated through suction by the suction source is transmitted to a holding surface 100a that is an exposed surface of the suction adhesion part 100 and is formed to be flush with the upper surface of the frame body 101 and thereby the spinner table 10 can suck and hold the workpiece W on the holding surface 100a. Spinner table rotation means 103 composed of a motor, a spindle whose axis direction is a Z-axis direction (vertical direction), and so forth is disposed on the lower side of the spinner table 10 and the spinner table 10 is enabled to rotate in a horizontal plane by the spinner table rotation means 103.

In the present embodiment, the ultrasonic water jet apparatus 2 is attached to the tip of a water supply pipe 12 that can pivot above the spinner table 10. The water supply pipe 12 extends in the horizontal direction and a water supply source 19 that is formed of a pump or the like and can send out cleaning water (for example, purified water) communicates with the rear end side of the water supply pipe 12 through a resin tube and a joint.

A pivot shaft 18 whose axis direction is the Z-axis direction is coupled to the rear end side of the water supply pipe 12 and the pivot shaft 18 is enabled to rotate by a pivot motor 17 coupled to the lower end thereof. The water supply pipe 12 has such a length as to reach at least the center of the spinner table 10 from the upper end of the pivot shaft 18. This allows the pivot shaft 18 to move the ultrasonic water jet apparatus 2 disposed at the tip of the water supply pipe 12 from the peripheral edge to the center of the workpiece W held by the spinner table 10.

Figure 2:
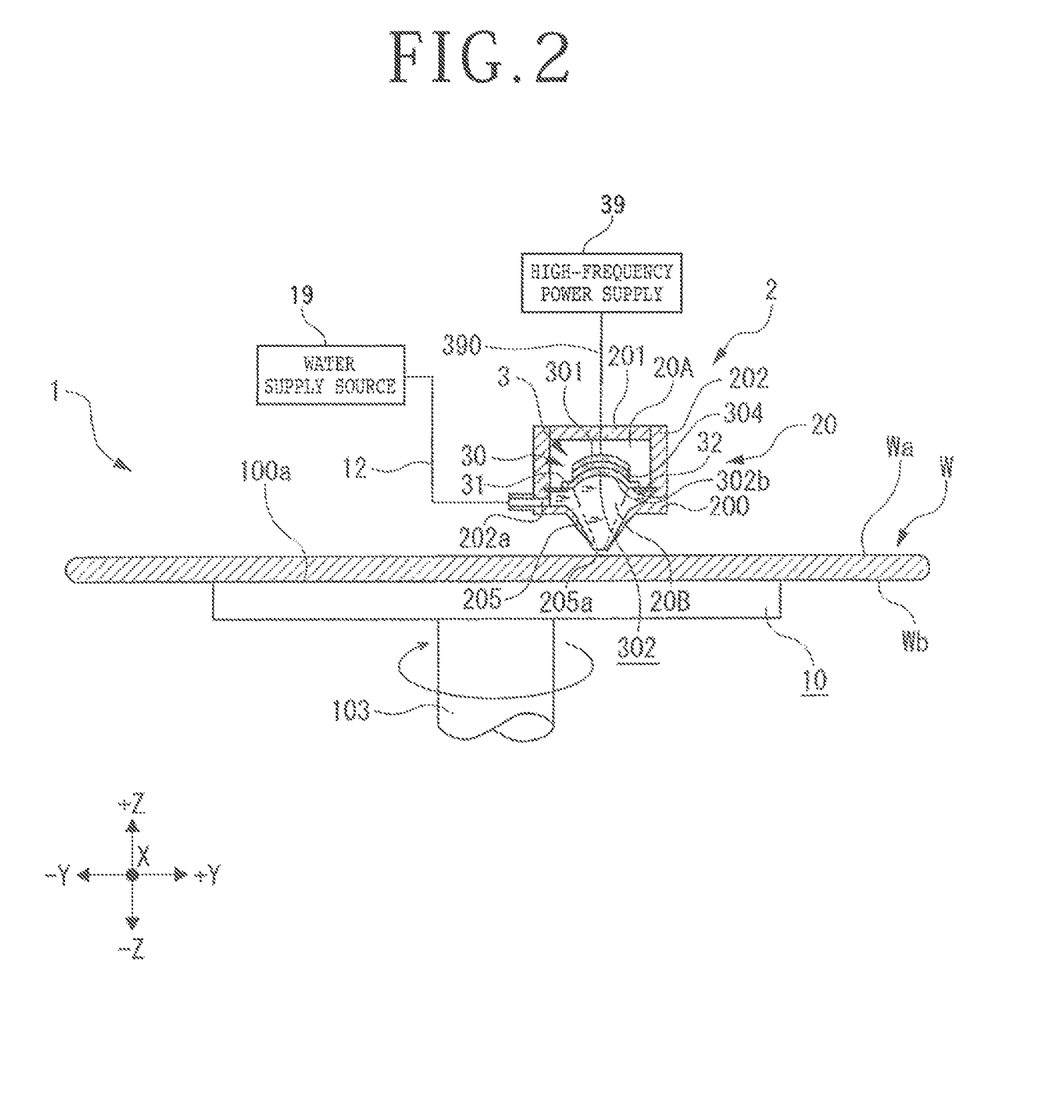
FIG. 2 is a sectional view for explaining a state in which the upper surface of a workpiece is being cleaned by ultrasonic cleaning water by using the spinner cleaning mechanism.

The ultrasonic water jet apparatus 2 according to the present invention depicted in FIGS. 1 and 2 is an apparatus that jets the cleaning water to which ultrasonic vibration is propagated to the workpiece W. As depicted in FIG. 2, the ultrasonic water jet apparatus 2 includes a water accumulation part 20 in which water supplied from the water supply source 19 is temporarily accumulated, a jet port 205a that jets the water accumulated in the water accumulation part 20, and a piezoelectric vibration plate 3 according to the present invention that is disposed opposed to the jet port 205a in the water accumulation part 20 and propagates ultrasonic vibration to the water accumulated in the water accumulation part 20.

For example, the water accumulation part 20 is formed into a substantially circular column shape and includes a bottom plate 200, a top plate 201 opposed to the bottom plate 200 in the Z-axis direction, and a sidewall 202 that is coupled to the bottom plate 200 and the top plate 201 and has a substantially circular cylindrical shape.

The inside of the water accumulation part 20 is segmented into upper and lower two chambers, i.e. a first chamber 20A on the upper side relative to the piezoelectric vibration plate 3 and a second chamber 20B on the lower side relative to the piezoelectric vibration plate 3, by the piezoelectric vibration plate 3 according to the present invention. Furthermore, in the sidewall 202 on the side of the second chamber 20B on the lower side, a water supply port 202a that penetrates the sidewall 202 is formed. The water supply pipe 12 communicates with the water supply port 202a. Therefore, the cleaning water supplied by the water supply source 19 is temporarily accumulated in the second chamber 20B of the water accumulation part 20.

A nozzle part 205 that protrudes to the −Z direction side is formed in the bottom plate 200. The diameter of the nozzle part 205 is gradually reduced toward the jet port 205a that jets the cleaning water at the tip thereof, for example. The nozzle part 205 may have a shape in which the diameter is not reduced toward the jet port 205a.

The piezoelectric vibration plate 3 according to the present invention is disposed at a position opposed to the jet port 205a in the water accumulation part 20 and includes a dome part 30, a flange part 31 that projects outward in the radial direction from the peripheral edge of the dome part 30, and an annular plate 32 that projects outward in the radial direction from the peripheral edge of the flange part 31.

For example, the dome part 30 is electrically connected to a high-frequency power supply 39 and is configured by overlapping a first electrode plate 301, a piezoelectric material 304, and a second electrode plate 302 in the Z-axis direction. The first electrode plate 301, the piezoelectric material 304, and the second electrode plate 302 are configured by a piezo element that is one kind of ceramic, for example, but are not limited thereto. The first electrode plate 301, the piezoelectric material 304, and the second electrode plate 302 are all formed into a dome shape.

The first electrode plate 301, the piezoelectric material 304, and the second electrode plate 302 are overlapped in such a manner that the recessed side faces the jet port 205*a*. An electrode that is not depicted in the diagram is attached to the first electrode plate 301 and the second electrode plate 302 and the high-frequency power supply 39 that applies an alternating-current voltage and supplies high-frequency power to the piezoelectric vibration plate 3 is connected to the plates 301 and 302 through the electrode and a wiring line 390.

The upper surface of the second electrode plate 302 on the projecting side is in tight contact with the lower surface of the first electrode plate 301 with the intermediary of the piezoelectric material 304. The lower surface of the second electrode plate 302 on the recessed side, i.e. the lower surface of the dome part 30 opposed to the jet port 205*a*, serves as a radiating surface 302*b* that radiates ultrasonic vibration toward the cleaning water temporarily accumulated in the second chamber 20B of the water accumulation part 20. In the present embodiment, the radiating surface 302*b* of the piezoelectric vibration plate 3 is formed into a dome shape similar to the inner surface of part of a spherical shape. However, it may be formed into a dome shape similar to the inner surface of a mortar. That is, it suffices that the radiating surface 302*b* be configured in such a manner that ultrasonic vibration concentrates toward the jet port 205*a*.

The flange part 31 that projects outward in the radial direction monolithically from the peripheral edge of the second electrode plate 302 of the dome part 30 and has a circular ring plate shape is formed of the same piezo element or the like as the dome part 30.

For example, the outer circumferential part of the annular plate 32 that projects outward in the radial direction from the peripheral edge of the flange part 31 is supported by the sidewall 202 of the water accumulation part 20 and the annular plate 32 fixes the dome part 30 in midair in the water accumulation part 20. It is preferable that the thickness of the annular plate 32 be 0.1 to 0.2 mm, for example, and the annular width (ring width) thereof be 3.0 mm, for example, and the material thereof be stainless steel, for example. Furthermore, the outer circumferential part with a 2.0 mm width in the annular plate 32 is supported by the sidewall 202 and the distance between the outer circumference of the dome part 30 and the sidewall 202 is 1.0 mm. Moreover, the annular plate 32 amplitudes the ultrasonic vibration by the part of 1.0 mm. The dome part 30 is formed in such a manner that the diameter of the radiating surface 302*b* is 16 mm and the diameter of the flange part 31 is 20 mm.

The case of cleaning the workpiece W by using the spinner cleaning mechanism 1 depicted in FIGS. 1 and 2 will be described below. First, the workpiece W is placed on the holding surface 100*a* of the spinner table 10 in such a manner that the center of the workpiece W substantially corresponds with the center of the holding surface 100*a*. Then, a suction force generated through actuation of the suction source that is not depicted in the diagram is transmitted to the holding surface 100*a* and thereby the spinner table 10 sucks and holds the workpiece W.

Thereafter, as depicted in FIG. 2, the spinner table rotation means 103 rotates the spinner table 10. Furthermore, the pivot motor 17 depicted in FIG. 1 rotates the pivot shaft 18 and thereby the ultrasonic water jet apparatus 2 is moved from an evacuation position outside the spinner table 10 to the upper side of the workpiece W, so that the jet port 205*a* is opposed to the upper surface Wa of the workpiece W.

Pressurized water is sent out from the water supply source 19 and this water passes through the water supply pipe 12 and is temporarily accumulated in the second chamber 20B of the water accumulation part 20 of the ultrasonic water jet apparatus 2. A predetermined amount of water is accumulated in the second chamber 20B of the water accumulation part 20 and the water pressure in the second chamber 20B rises, so that the cleaning water is jetted downward from the jet port 205*a*. The water continues to be supplied from the water supply source 19 and thereby the predetermined amount of water is always accumulated in the second chamber 20B.

Furthermore, the high-frequency power supply 39 supplies high-frequency power to the piezoelectric vibration plate 3. Specifically, turning on and off of application of a voltage are repeated by the high-frequency power supply 39 at a predetermined frequency (for example, 1 to 3 MHz) and thereby expansion and contraction motion in the upward-downward direction is generated in the first electrode plate 301 and the piezoelectric material 304. Then, this expansion and contraction motion becomes mechanical ultrasonic vibration. The second electrode plate 302 resonates with the vibration of the first electrode plate 301 and thereby propagates the ultrasonic vibration from the radiating surface 302*b* that is a recess surface gently recessed as viewed from the side of the jet port 205*a* to the water accumulated in the second chamber 20B of the water accumulation part 20. Furthermore, the ultrasonic vibration propagated from the radiating surface 302*b*, which is the recess surface, to this water concentrates toward the jet port 205*a*.

Due to proper setting of the curvature of the radiating surface 302*b* and the distance from the radiating surface 302*b* to the jet port 205*a*, the ultrasonic vibration that is generated from the radiating surface 302*b* of the piezoelectric vibration plate 3 and is propagated to the water can be caused to form a focus at a predetermined position separate downward from the jet port 205*a* by a distance in a range of e.g. approximately several millimeters to several tens of millimeters (for example, upper surface Wa of the workpiece W) and be concentrated at this position. Then, the cleaning water jetted from the jet port 205*a* of the nozzle part 205 toward the external is jetted as ultrasonic cleaning water to which the ultrasonic vibration is propagated and the upper surface Wa of the workpiece W can be cleaned by this ultrasonic cleaning water.

Here, due to the annular plate 32 depicted in FIG. 2, the dome part 30 that generates the ultrasonic vibration is in the state of being not held directly by the sidewall 202 of the water accumulation part 20. Therefore, it becomes easier for the dome part 30 to vibrate when the high-frequency power is supplied to the piezoelectric vibration plate 3, and the ultrasonic vibration that has been amplified by the annular plate 32 and has large amplitude can be effectively propagated to the cleaning water.

Due to this, processing dust and so forth that adhere to the upper surface Wa of the workpiece W vibrate due to the ultrasonic cleaning water and get separated from the upper surface Wa. Then, due to a centrifugal force generated by the rotation of the spinner table 10, the processing dust and so forth flow on the upper surface Wa of workpiece W outward in the radial direction together with the ultrasonic cleaning water and flow down from on the spinner table 10 to the case that is not depicted in the diagram. Furthermore, for example, the ultrasonic water jet apparatus 2 pivotally moves to reciprocate over the workpiece W at a predetermined angle in such a manner as to pass above the center of the workpiece W and thereby the whole of the upper surface Wa of the workpiece W is cleaned by the ultrasonic cleaning water.

As described above, the piezoelectric vibration plate 3 according to the present invention includes the dome part 30, the flange part 31 that projects outward in the radial direction from the peripheral edge of the dome part 30, and the annular plate 32 that projects outward in the radial direction from the peripheral edge of the flange part 31. This can dispose the piezoelectric vibration plate 3 on the sidewall 202 of the water accumulation part 20 as the disposing place through the annular plate 32. That is, it becomes possible to make the state in which the dome part 30 that generates the ultrasonic vibration is not directly held at the sidewall 202 of the water accumulation part 20. For this reason, it becomes easier for the dome part 30 to vibrate when the high-frequency power is supplied to the piezoelectric vibration plate 3. Furthermore, the thickness, annular width (ring width), material, and so forth of the annular plate 32 are set in such a manner that the ultrasonic vibration generated from the dome part 30 of the piezoelectric vibration plate 3 is amplified by the annular plate 32. This makes it possible to propagate the ultrasonic vibration with a frequency of 1 to 3 MHz, for example, generated from the piezoelectric vibration plate 3 to the cleaning water with larger amplitude than conventional ultrasonic vibration, and the cleaning effect of the cleaning water can be improved. In addition, the ultrasonic cleaning water obtained by propagating the ultrasonic vibration from the piezoelectric vibration plate 3 to the cleaning water can widen the cleaning width compared with the conventional technique and enables shortening of the cleaning time. Moreover, the ultrasonic cleaning water obtained by propagating the ultrasonic vibration from the piezoelectric vibration plate 3 to the cleaning water makes it possible to execute cleaning through raking out dirt accumulated in recessed parts by the ultrasonic vibration even when the upper surface Wa that is the cleaning-target surface of the workpiece W has recesses and protrusions.

As described above, the ultrasonic water jet apparatus 2 according to the present invention that jets the cleaning water to which the ultrasonic vibration is propagated to the workpiece W includes the water accumulation part 20 in which water supplied from the water supply source 19 is temporarily accumulated, the jet port 205a that jets the water accumulated in the water accumulation part 20, and the piezoelectric vibration plate 3 that is disposed opposed to the jet port 205a in the water accumulation part 20 and propagates the ultrasonic vibration to the water accumulated in the water accumulation part 20. The recessed surface side (side of the radiating surface 302b) of the dome part 30 of the piezoelectric vibration plate 3 is oriented toward the jet port 205a and the outer circumferential part of the annular plate 32 of the piezoelectric vibration plate 3 is supported by the sidewall 202 of the water accumulation part 20. Due to this, the ultrasonic vibration generated from the piezoelectric vibration plate 3 due to the high-frequency power supplied to the piezoelectric vibration plate 3 can be concentrated toward the jet port 205a and the cleaning water to which the ultrasonic vibration is propagated in the water accumulation part 20 can be jetted from the jet port 205a. That is, the state in which the dome part 30 of the piezoelectric vibration plate 3 that generates the ultrasonic vibration is not held directly by the sidewall 202 of the water accumulation part 20 is made, and it becomes easier for the dome part 30 to vibrate when the high-frequency power is supplied to the piezoelectric vibration plate 3. Furthermore, it becomes possible to propagate the ultrasonic vibration that has been amplified by the annular plate 32 and has larger amplitude than conventional ultrasonic vibration to the cleaning water and the cleaning effect of the ultrasonic cleaning water can be improved.

(Cutting Apparatus Including Ultrasonic Water Jet Apparatus)

Figure 3:
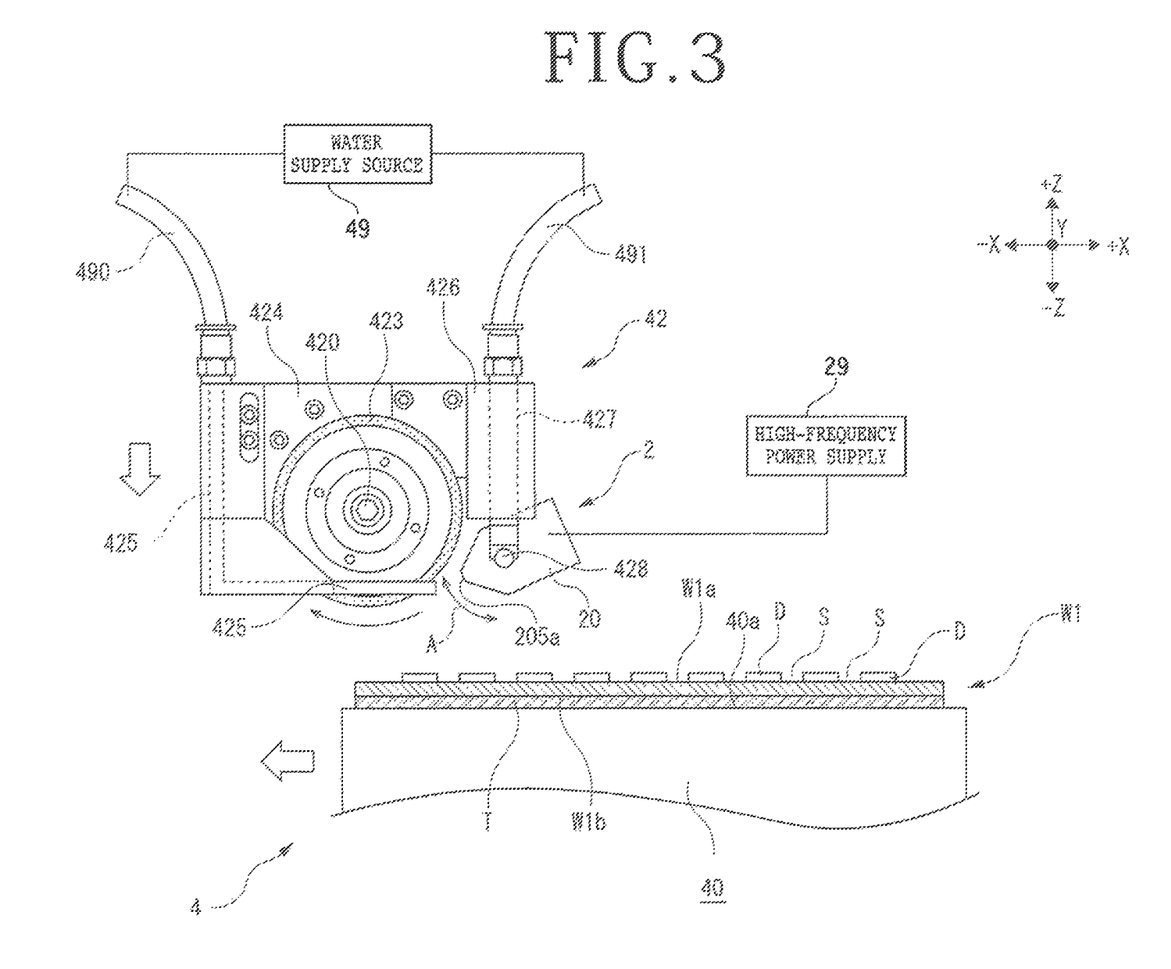
FIG. 3 is a side view depicting one example of a cutting apparatus including the ultrasonic water jet apparatus.

As depicted in FIG. 3, the ultrasonic water jet apparatus 2 according to the present invention may be disposed in a cutting apparatus 4 that executes cutting processing for a workpiece W1 held by a chuck table 40 by a cutting unit 42. For example, the chuck table 40 of the cutting apparatus 4 has a circular plate shape as its outer shape and can suck and hold the workpiece W1 on a flat holding surface 40a that is formed of a porous member or the like and communicates with a suction source that is not depicted in the diagram. The chuck table 40 is capable of reciprocating movement in an X-axis direction and can rotate around a rotation axis whose axis direction is the Z-axis direction and that is not depicted in the diagram.

For example, the workpiece W1 depicted in FIG. 3 is a circular semiconductor wafer whose base material is silicon, and devices D are formed in lattice-like regions marked out by plural planned dividing lines S on a front surface W1a oriented upward. Furthermore, a dicing tape T is stuck to a back surface W1b oriented downward in the workpiece W1 and the back surface W1b is protected. For example, the thickness of the workpiece W1 is 1 mm, which is twice the conventional thickness. The workpiece W1 may be composed of gallium arsenide, sapphire, ceramic, resin, gallium nitride, silicon carbide, or the like besides silicon. The outer shape thereof may also be shaped into not a circular shape but a rectangular shape, for example. Furthermore, the workpiece W1 may be supported by a ring-shaped frame that is not depicted in the diagram with the intermediary of the dicing tape T in such a manner that handling thereof is possible.

For example, the cutting unit 42 includes a spindle 420 whose axis direction is a Y-axis direction, a circular-ring-shaped cutting blade 423 mounted to the spindle 420, and a blade cover 424 that covers the cutting blade 423, and is capable of reciprocating movement in the Z-axis direction (vertical direction) and the Y-axis direction orthogonal to the Z-axis direction in the horizontal plane. Furthermore, in association with rotational driving of the spindle 420 by a motor that is not depicted in the diagram, the cutting blade 423 also rotates at high speed.

The blade cover 424 depicted in FIG. 3 has a substantially circular opening in a central region thereof and the cutting blade 423 mounted to the tip side of spindle 420 is housed in this substantially circular opening. The blade cover 424 is fixed to a spindle housing that supports the spindle 420 rotatably and is not depicted in the diagram.

The blade cover 424 supports a pair of cutting water nozzles 425 (only single nozzle is depicted) with a substantially L-shape as viewed from the Y direction side. The pair of cutting water nozzles 425 extend in the X-axis direction in parallel to each other in such a manner as to sandwich the lower part of the cutting blade 423 from both sides in the blade thickness direction (Y-axis direction). The upper end of each of the pair of cutting water nozzles 425 communicates with a water supply source 49 through a resin tube 490 or the like. The pair of cutting water nozzles 425 have plural slits in the inside surface that faces the side surface of the cutting blade 423 and a processing point that is the contact part between the cutting blade 423 and the workpiece W1 is cooled and cleaned by cutting water jetted from the slits.

A support block 426 that supports the ultrasonic water jet apparatus 2 is attached to the side surface of the blade cover 424 on the +X direction side. In the support block 426, a water supply pipe 427 in which the other end side communicates with the water supply source 49 through a resin tube 491 is disposed to extend in the Z-axis direction. Furthermore, one end side of the water supply pipe 427 is connected to the water supply port 202a (see FIG. 4) of the ultrasonic water jet apparatus 2 attached to the lower end side of the support block 426.

The ultrasonic water jet apparatus 2 is attached to the support block 426 depicted in FIG. 3 with the intermediary of a rotation axis 428, and angle adjustment thereof in a direction of an arrow A is possible. Furthermore, cleaning water jetted from the jet port 205a of the ultrasonic water jet apparatus 2 is supplied to a processing point that is the contact part between the cutting blade 423 and the workpiece W1 from the outer circumferential direction of the cutting blade 423.

The case of cutting the workpiece W1 by using the cutting apparatus 4 depicted in FIG. 3 will be described below. First, the workpiece W1 is placed on the holding surface 40a of the chuck table 40 in such a manner that the front surface W1a is set on the upper side. Then, a suction force generated by the suction source that is not depicted in the diagram is transmitted to the holding surface 40a and thereby the chuck table 40 sucks and holds the workpiece W1 on the holding surface 40a. Furthermore, the state in which the center of the workpiece W1 substantially corresponds with the center of the holding surface 40a is obtained.

After the workpiece W1 is held by the chuck table 40, the coordinate position in the Y-axis direction regarding the planned dividing line S into which the cutting blade 423 should be made to cut into on the workpiece W1 is detected by alignment means that is not depicted in the diagram. In association with the detection of the coordinate position of the planned dividing line S, the cutting unit 42 moves in the Y-axis direction and position adjustment in the Y-axis direction between the targeted planned dividing line S and the cutting blade 423 is executed.

After the above-described position adjustment, the chuck table 40 that holds the workpiece W1 is sent in the −X direction at a predetermined cutting feed speed. Furthermore, the cutting unit 42 moves down in the −Z direction and, for example, the cutting unit 42 is positioned at a predetermined height position with which the cutting blade 423 cuts through the back surface W1b of the workpiece W1 to reach the dicing tape T.

Figure 4:
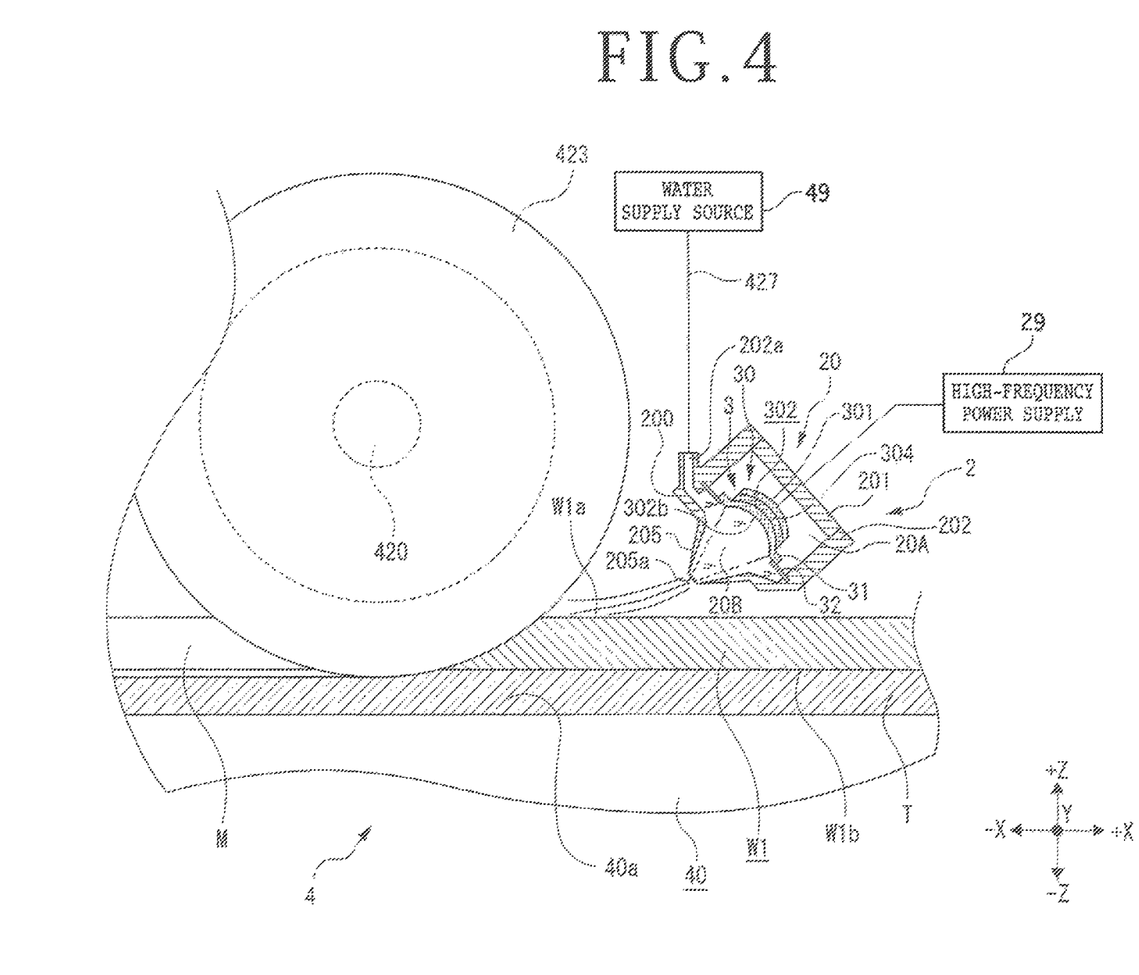
FIG. 4 is a sectional view for explaining a state in which cutting processing is being executed for a workpiece by using the cutting apparatus.

As depicted in FIG. 4, the motor that is not depicted in the diagram rotates the spindle 420 at high speed in the clockwise direction as viewed from the near side of the plane of paper and the cutting blade 423 fixed to the spindle 420 cuts into the workpiece W1 while rotating at high speed in association with the rotation of the spindle 420 to cut the planned dividing line S and form a cut groove M (fully-cut groove M) along the planned dividing line S depicted in FIG. 4. The workpiece W1 may be half-cut instead of being fully cut.

In the cutting processing, by the pair of cutting water nozzles 425 depicted in FIG. 3, the cutting water is jetted to the contact part between the cutting blade 423 and the workpiece W1 (processing point) and the surroundings thereof from the blade thickness direction (Y-axis direction) of the cutting blade 423 and the contact part (cutting point) and the surroundings thereof are cooled and cleaned.

Furthermore, in the cutting processing, pressurized water is supplied from the water supply source 49 and this water passes through the water supply pipe 427 and is temporarily accumulated in the second chamber 20B of the water accumulation part 20 of the ultrasonic water jet apparatus 2. Then, the water pressure in the second chamber 20B rises and the cleaning water is jetted from the jet port 205a toward the obliquely lower side and is supplied to the processing point that is the contact part between the cutting blade 423 and the workpiece W1 from the outer circumferential direction of the cutting blade 423. Due to continuation of the supply of the water from the water supply source 49, a predetermined amount of water is always accumulated in the second chamber 20B.

Moreover, a high-frequency power supply 29 depicted in FIG. 4 supplies high-frequency power to the piezoelectric vibration plate 3 according to the present invention disposed in the water accumulation part 20 of the ultrasonic water jet apparatus 2. Thereby, ultrasonic vibration with a frequency of 1 to 3 MHz, for example, is propagated from the radiating surface 302b of the piezoelectric vibration plate 3 that is a recess surface gently recessed as viewed from the side of the jet port 205a to the water accumulated in the second chamber 20B of the water accumulation part 20. In addition, the ultrasonic vibration propagated from the radiating surface 302b, which is the recess surface, to this water concentrates toward the jet port 205a.

Due to proper setting of the curvature of the radiating surface 302b and the distance from the radiating surface 302b to the jet port 205a, the ultrasonic vibration that is generated from the radiating surface 302b and is propagated to the cleaning water can be caused to form a focus at a predetermined position separate obliquely downward from the jet port 205a by a distance in a range of e.g. approximately several millimeters to several tens of millimeters, i.e. the contact part between the cutting blade 423 and the workpiece W1 (processing point), and be concentrated at this processing point. In this manner, the cleaning water jetted from the jet port 205a of the nozzle part 205 toward the external is jetted as the ultrasonic cleaning water to which the ultrasonic vibration is propagated, so that cutting dust generated at the processing point can be cleaned and removed from the inside of the cut groove M by this ultrasonic cleaning water.

Here, due to the annular plate 32 depicted in FIG. 4, the dome part 30 that generates the ultrasonic vibration is in the state of being not held directly by the sidewall 202 of the water accumulation part 20. Therefore, it becomes easier for the dome part 30 to vibrate when the high-frequency power is supplied to the piezoelectric vibration plate 3, and the ultrasonic vibration that has been amplified by the annular plate 32 and has larger amplitude than conventional ultrasonic vibration can be effectively propagated to the cleaning water. For this reason, the ultrasonic water jet apparatus 2 including the piezoelectric vibration plate 3 according to the present invention can effectively clean and remove cutting dust by the jetted ultrasonic cleaning water from the inside of the cut groove M with a large depth in the workpiece W1 whose thickness is as large as e.g. 1 mm, which is larger than conventional thickness.

When the workpiece W1 has been sent to a predetermined position in the X-axis direction at which the cutting blade 423 has finished the cutting of the one planned dividing line S, the cutting feed of the workpiece W1 is stopped once and the cutting blade 423 gets separated from the workpiece W1. Subsequently, while indexing feed of the chuck table 40 is executed in the Y-axis direction by the interval between the planned dividing lines S adjacent to each other, the chuck table 40 moves in the +X direction to return to the origin position. The same cutting is sequentially executed and all planned dividing lines S of the same direction are cut. Moreover, the chuck table 40 rotates by 90 degrees and thereafter the same cutting is executed. Thereby, all planned dividing lines S are fully cut along the two directions orthogonal to each other and the workpiece W1 is divided into individual chips including the devices D.

(Ultrasonic Dividing Apparatus Including Ultrasonic Vibration Horn)

Figure 5:
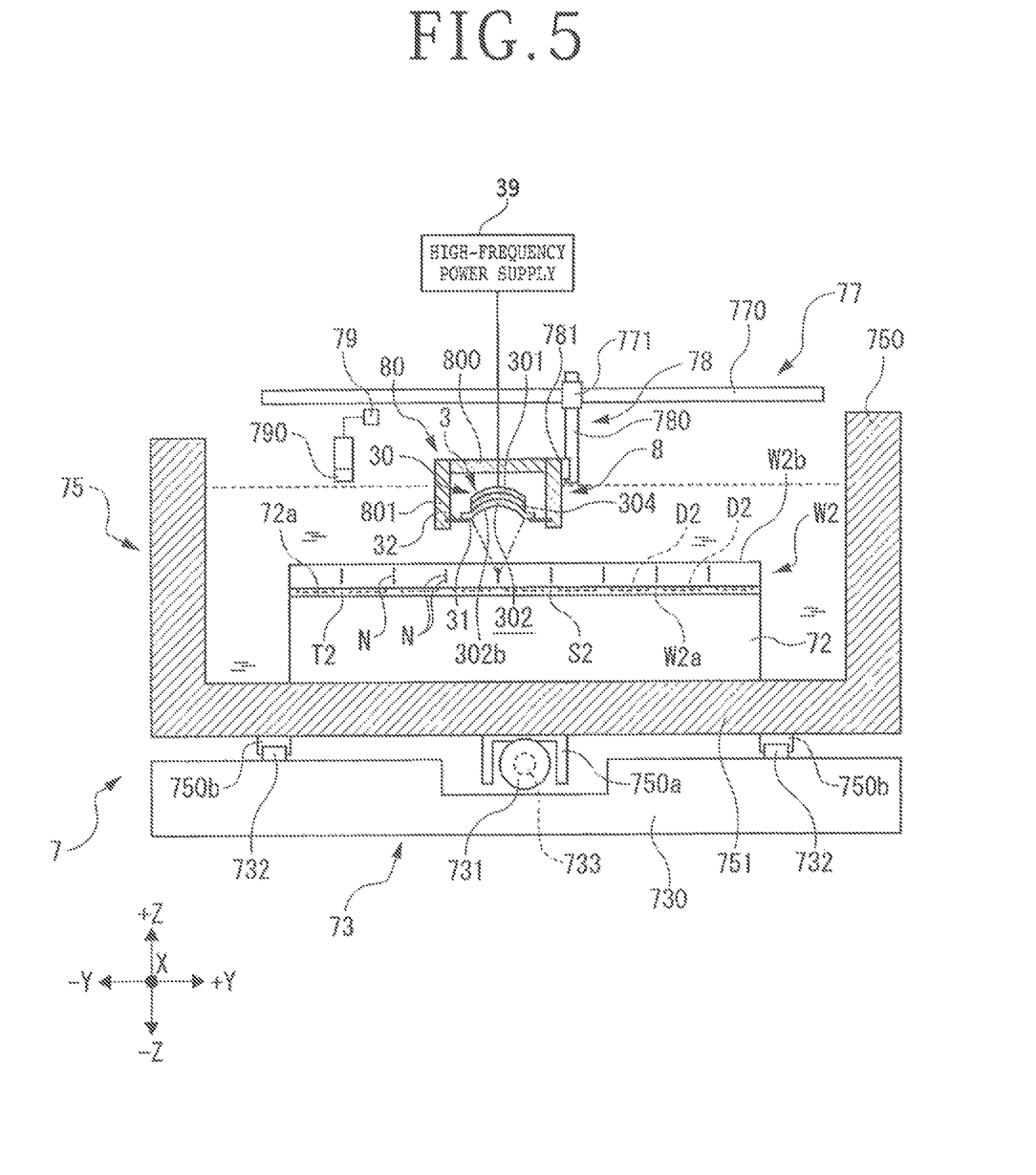
FIG. 5 is a sectional view for explaining a state in which a workpiece is being divided with use of a dividing origin position as the point of origin by using an ultrasonic dividing apparatus including an ultrasonic vibration horn.

An ultrasonic dividing apparatus 7 depicted in FIG. 5 is apparatus that divides a workpiece W2 by concentrating ultrasonic vibration generated from an ultrasonic vibration horn 8 according to the present invention at one point and giving the ultrasonic vibration to the workpiece W2 through water, for example.

For example, the workpiece W2 depicted in FIG. 5 is a circular semiconductor wafer whose base material is silicon, and plural planned dividing lines S2 are set to be orthogonal to each other in a front surface W2a in the state of being oriented downward in the workpiece W2. Furthermore, devices D2 are each formed in plural lattice-like regions marked out by the planned dividing lines S2. A tape T2 (for example, expanding tape T2) with substantially the same diameter as the workpiece W2 is stuck to the front surface W2a of the workpiece W2 and the front surface W2a is protected. When the workpiece W2 is divided into individual chips along the planned dividing lines S2, the tape T2 prevents the chips from being scattered. The workpiece W2 is not limited to the silicon wafer. Moreover, the workpiece W2 may be supported by a ring-shaped frame that is not depicted in the diagram with the intermediary of the tape T2 in such a manner that handling thereof is possible.

The workpiece W2 is irradiated with a laser beam with such a wavelength as to be transmitted through the workpiece W2 along the planned dividing lines S2, and dividing origin points N (modified layers N) are continuously formed in a straight line manner at positions of predetermined depths inside the workpiece W2 along the planned dividing lines S2 that extend in the X-axis direction and the Y-axis direction.

The dividing origin points N are regions in which the strength is lowered compared with the surroundings through modification of the inside of the workpiece W2 due to the irradiation with the laser beam. From each of the dividing origin points N, cracks may extend in the front surface W2a or the back surface W2b of the workpiece W2. Furthermore, in the present embodiment, the dividing origin points N are formed at plural stages also in the thickness direction of the workpiece W2 (Z-axis direction). However, the dividing origin points N may be formed only at one stage in the thickness direction of the workpiece W2.

The ultrasonic dividing apparatus 7 includes a water tank 75 as depicted in FIG. 5. The water tank 75 in which the whole of the workpiece W2 can be submerged is composed of a sidewall 750 and a bottom plate 751 monolithically connected to the lower part of the sidewall 750 and communicates with a water supply source that can supply purified water for example, and is not depicted in the diagram.

A placement table 72 on which to place the workpiece W2 is disposed on the bottom plate 751. The placement table 72 has a flat placement surface 72a parallel to the X-axis-Y-axis plane and can rotate by at least 90 degrees in the X-axis-Y-axis plane by a rotation axis whose axis direction is the Z-axis direction and that is not depicted in the diagram. For example, when handling of the workpiece W2 by a ring-shaped frame that is not depicted in the diagram is possible, plural clamps for clamping and fixing this ring-shaped frame may be disposed around the placement table 72 at equal intervals in the circumferential direction.

The water tank 75 is capable of reciprocating movement in the X-axis direction by X-axis movement means 73 disposed on the lower side of the water tank 75. For example, the X-axis movement means 73 that moves the water tank 75 in the X-axis direction includes an X-axis base 730 that extends in the X-axis direction, a ball screw 731 that has the axis center in the X-axis direction and is disposed on the X-axis base 730, a pair of guide rails 732 disposed in parallel to the ball screw 731, and a motor 733 that rotates the ball screw 731.

A nut 750a that screws to the ball screw 731 is disposed at the center of the lower surface of the bottom plate 751 of the water tank 75 and sliders 750b loosely fitted to the pair of guide rails 732 are disposed in regions on both sides in the Y-axis direction on the lower surface of the bottom plate 751. Furthermore, when the motor 733 rotates the ball screw 731, the water tank 75 is guided by the pair of guide rails 732 to linearly move in the X-axis direction in association with this rotation.

The ultrasonic vibration horn 8 according to the present invention depicted in FIG. 5 is capable of reciprocating movement in a horizontal manner in the Y-axis direction above the water tank 75 by Y-axis movement means 77. The Y-axis movement means 77 includes a linear movement shaft 770 that extends in the Y-axis direction and a Y-axis movable member 771 capable of free slide movement on the linear movement shaft 770 in the Y-axis direction. Furthermore, the ultrasonic vibration horn 8 is disposed to the Y-axis movable member 771 with the intermediary of Z-axis movement means 78.

The Z-axis movement means 78 includes a linear movement shaft 780 that extends in the Z-axis direction (vertical direction) orthogonal to the X-axis-Y-axis plane and a Z-axis movable member 781 capable of free slide movement on the linear movement shaft 780 in the Z-axis direction. Moreover, the ultrasonic vibration horn 8 is attached to the Z-axis movable member 781.

The ultrasonic vibration horn 8 according to the present invention that is disposed in the ultrasonic dividing apparatus 7 and concentrates ultrasonic vibration at one point to give the ultrasonic vibration to the workpiece W2 placed on the placement table 72 includes the piezoelectric vibration plate 3 according to the present invention described by using FIG. 2 previously and a housing 80 that supports the annular plate 32 of the piezoelectric vibration plate 3 in such a manner that the recessed surface side (side of the radiating surface 302b) of the dome part 30 of the piezoelectric vibration plate 3 is oriented toward the side of the one point at which the ultrasonic vibration is desired to be concentrated.

For example, the housing 80 includes a circular top plate 800 and a circular cylindrical sidewall 801 coupled to the top plate 800. In the piezoelectric vibration plate 3 to which the high-frequency power supply 39 is electrically connected, the outer circumferential part of the annular plate 32 is supported by a sidewall 801 in the state in which the side of the recessed radiating surface 302b of the dome part 30 is oriented downward, and the dome part 30 is fixed in midair in the housing 80.

For example, the ultrasonic dividing apparatus 7 includes alignment means 79 that detects the position of the dividing origin point N formed inside the workpiece W2 along the planned dividing line S2 of the workpiece W2. For example, the alignment means 79 includes infrared irradiation means that irradiates the workpiece W2 with infrared and is not depicted in the diagram and an infrared camera 790 composed of an optical system that captures the infrared, an imaging element (infrared charge-coupled device (CCD)) that outputs an electrical signal corresponding to the infrared, and so forth.

The case of dividing the workpiece W2 with use of the dividing origin points N as the point of origin by using the ultrasonic dividing apparatus 7 depicted in FIG. 5 will be described below. First, the workpiece W2 is placed on the placement surface 72a of the placement table 72 in the water tank 75 in such a manner that the back surface W2b that is the opposite surface of the front surface W2a is set on the upper side. Then, the workpiece W2 is fixed to the placement table 72 by a publicly-known method. That is, if the workpiece W2 is supported by the ring-shaped frame that is not depicted in the diagram and the tape T2, for example, this ring-shaped frame is fixed by clamps.

Thereafter, the placement table 72 depicted in FIG. 5 rotates by a predetermined angle θ and thereby θ adjustment (parallel setting) by which the planned dividing lines S2 are adjusted to be parallel to the X-axis direction is executed. If the ultrasonic dividing apparatus 7 includes a mechanism to place the workpiece W2 on the placement table 72 in such a manner that the planned dividing lines S2 are in parallel to the X-axis direction, this θ adjustment does not have to be executed.

Furthermore, concurrently with the θ adjustment, the planned dividing line S2 is detected by the alignment means 79. Here, the front surface W2a of the workpiece W2 in which the planned dividing lines S2 are formed is located on the lower side and is not opposed directly to the alignment means 79. However, the planned dividing line S2 can be imaged by the infrared camera 790 through transmission through the workpiece W2 from the side of the back surface W2b. Then, image processing of pattern matching or the like is executed based on an image acquired by the infrared camera 790 and the Y-axis coordinate position of the planned dividing line S2 of the front surface W2a of the workpiece W2 in the horizontal plane, i.e. the Y-axis coordinate position of the dividing origin position N in the horizontal plane, can be detected.

Next, the water supply source that is not depicted in the diagram supplies water into the water tank 75 and thereby the inside of the water tank 75 is filled with a predetermined amount of water. Thus, by the water accumulated in the water tank 75, the workpiece W2 held by the placement table 72 is submerged.

The Y-axis movement means 77 moves the ultrasonic vibration horn 8 in the Y-axis direction, and the ultrasonic vibration horn 8 is positioned at a predetermined Y-axis coordinate position in such a manner that the targeted planned dividing line S2 whose coordinate position has been detected is aligned with the center of the dome part 30 of the piezoelectric vibration plate 3 of the ultrasonic vibration horn 8, for example.

Furthermore, the Z-axis movement means 78 raises and lowers the ultrasonic vibration horn 8 in the Z-axis direction, and the ultrasonic vibration horn 8 is positioned to a predetermined height in such a manner that the focus at which the ultrasonic vibration of the piezoelectric vibration plate 3 is concentrated substantially corresponds with the height of the dividing origin position N formed inside the workpiece W2. The height of the focus at which the ultrasonic vibration of the piezoelectric vibration plate 3 is concentrated may be adjusted to the height of the back surface W2b of the workpiece W2.

The high-frequency power supply 39 supplies high-frequency power to the piezoelectric vibration plate 3 and thereby ultrasonic vibration with a frequency of 1 to 3 MHz for example, is propagated from the radiating surface 302b of the piezoelectric vibration plate 3 to the water accumulated in the water tank 75. Due to proper setting of the curvature of the radiating surface 302b and so forth, the ultrasonic vibration that is generated from the radiating surface 302b and is propagated to the water forms a focus at the dividing origin position N in the workpiece W2 and concentrates at the dividing origin position N.

The water tank 75 is sent in the −X direction (to the far side of the plane of paper) for example, at a predetermined processing feed speed. Thereby, the ultrasonic vibration is given to the dividing origin position N formed along the planned dividing line S2 that extends in the X-axis direction and the workpiece W2 is divided along the planned dividing line S2 with the dividing origin position N being the point of origin.

When the water tank 75 has been sent in the −X direction to a predetermined position at which the giving of the ultrasonic vibration to the dividing origin position N along one planned dividing line S2 has finished, the ultrasonic vibration horn 8 is moved in the Y-axis direction and position adjustment in the Y-axis direction is executed between the planned dividing line S2 adjacent to the planned dividing line S2 used as the basis in the processing feed in the −X direction and the ultrasonic vibration horn 8. Processing feed of the water tank 75 is executed in the +X direction (to the near side of the plane of paper), which is the backward direction, and the ultrasonic vibration is given to the workpiece W2 similarly to the giving of the ultrasonic vibration to the workpiece W2 in the forward direction. The same giving of the ultrasonic vibration to the workpiece W2 is sequentially executed along all planned dividing lines S2 that extend in the X-axis direction. Thereafter, the placement table 72 is rotated by 90 degrees and then the same giving of the ultrasonic vibration to the workpiece W2 is executed. Thereby, all planned dividing lines S2 are divided along the two directions orthogonal to each other with the dividing origin positions N being the point of origin and the workpiece W2 is divided into individual chips including the devices D2.

As described above, the ultrasonic vibration horn 8 according to the present invention that concentrates ultrasonic vibration at one point and gives the ultrasonic vibration to the workpiece W2 through water for example, includes the piezoelectric vibration plate 3 and the housing 80 that supports the annular plate 32 of the piezoelectric vibration plate 3 in such a manner that the side of the recessed radiating surface 302b of the dome part 30 of the piezoelectric vibration plate 3 is oriented toward the side of the one point at which the ultrasonic vibration is desired to be concentrated. Due to this, the dome part 30 of the piezoelectric vibration plate 3 that generates the ultrasonic vibration is not held directly by the housing 80. Therefore, it becomes easier for the dome part 30 to vibrate when high-frequency power is supplied to the piezoelectric vibration plate 3. Furthermore, it becomes possible to propagate the ultrasonic vibration to the water for example, with large amplitude resulting from amplification of the vibration of the dome part 30 by the annular plate 32 compared with conventional ultrasonic vibration, and it is possible to surely execute dividing by giving of the ultrasonic vibration to the workpiece W2 including the dividing origin points N through the water.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An ultrasonic water jet apparatus that jets water to which ultrasonic vibration is propagated to a workpiece, the ultrasonic water jet apparatus comprising:
    a water accumulation part in which the water supplied from a water supply source is temporarily accumulated, the water accumulation part in fluid communication with a water supply port through which the water accumulation part receives the water from the water supply;
    a jet port that jets the water accumulated in the water accumulation part;
    a piezoelectric vibration plate including a dome part that is disposed opposed to the jet port in the water accumulation part and propagates the ultrasonic vibration to the water accumulated in the water accumulation part, a flange part that projects outward in a radial direction from a peripheral edge of the dome part, and an annular plate that projects outward in the radial direction from a peripheral edge of the flange part; and,
    a housing that supports the annular plate,
    wherein a recessed surface side of the dome part of the piezoelectric vibration plate is oriented toward the jet port and an outer circumferential part of the annular plate of the piezoelectric vibration plate is supported by a sidewall of the water accumulation part and extends in the radial direction therefrom, and
    the ultrasonic vibration generated from the piezoelectric vibration plate by high-frequency power supplied to the piezoelectric vibration plate is concentrated toward the jet port and the water to which the ultrasonic vibration is propagated in the water accumulation part is jetted from the jet port,
    wherein the flange part is integral with the dome part and supported in the water accumulation part by the annular plate,
    wherein the water supply port and the jet part are located on the recessed surface side of the dome part,
    wherein an outer circumferential part of the annular plate projects inwardly in the radial direction from an inner surface of a sidewall of the housing.

2. A piezoelectric vibration plate comprising:
    a dome part;
    a flange part that projects outward in a radial direction from a peripheral edge of the dome part;
    an annular plate that projects outward in the radial direction from a peripheral edge of the flange part, and
    a housing that supports the annular plate,
    wherein the flange part is integral with the dome part and supported by the annular plate,
    wherein the dome part comprises a pair of electrodes, and the flange part is integral with a first electrode of the pair of electrodes, and
    wherein the pair of electrodes are arranged in stacked relationship, and the first electrode is a lower electrode in the stacked relationship,
    wherein an outer circumferential part of the annular plate projects inwardly in the radial direction from an inner surface of a sidewall of the housing.

3. The piezoelectric vibration plate of claim 2, wherein
    an outer circumferential part of the annular plate projects outwardly in the radial direction from the peripheral edge of the flange part and is supported by a sidewall of a water accumulation part and the annular plate fixes the dome part in midair within the water accumulation part.

4. The ultrasonic water jet apparatus of claim 1, wherein the dome part comprises a pair of electrodes, and the flange part is integral with a first electrode of the pair of electrodes.

5. The ultrasonic water jet apparatus of claim 4, wherein the pair of electrodes are arranged in stacked relationship, and the first electrode is a lower electrode in the stacked relationship.

6. An ultrasonic vibration horn that concentrates ultrasonic vibration at one point and gives the ultrasonic vibration to a workpiece, the ultrasonic vibration horn comprising:
    a piezoelectric vibration plate including a dome part, a flange part that projects outward in a radial direction from a peripheral edge of the dome part, and an annular plate that projects outward in the radial direction from a peripheral edge of the flange part; and
    a housing that supports the annular plate of the piezoelectric vibration plate in such a manner that a recessed surface side of the dome part is oriented toward a side of the one point at which the ultrasonic vibration is desired to be concentrated,
    wherein the flange part is integral with the dome part and supported in the water accumulation part by the annular plate,
    wherein the dome part comprises a pair of electrodes, and the flange part is integral with a first electrode of the pair of electrodes,
    wherein the pair of electrodes are arranged in stacked relationship, and the first electrode is a lower electrode in the stacked relationship, and
    wherein an outer circumferential part of the annular plate projects inwardly in the radial direction from an inner surface of a sidewall of the housing.

* * * * *